United States Patent [19]
Park et al.

[11] Patent Number: 5,668,064
[45] Date of Patent: Sep. 16, 1997

[54] METHOD OF FORMING A TUNGSTEN PLUG IN A SEMICONDUCTOR DEVICE

[75] Inventors: Sang Hoon Park, Kyungki-do; Dong Sauk Kim, Sungnam-shi; Ju Il Lee, Kyungki-do, all of Rep. of Korea

[73] Assignee: Hyundai Electronics Industries Co., Ltd., Kyungki-do, Rep. of Korea

[21] Appl. No.: 606,305

[22] Filed: Feb. 23, 1996

[30] Foreign Application Priority Data

Feb. 24, 1995 [KR] Rep. of Korea .......... 95-3610

[51] Int. Cl.⁶ .................................. H01L 21/60
[52] U.S. Cl. ................. 438/637; 438/675; 438/685
[58] Field of Search ................ 437/228; 156/646.1, 156/643.1, 651.1, 656.1

[56] References Cited

U.S. PATENT DOCUMENTS

| | | | |
|---|---|---|---|
| 5,231,051 | 7/1993 | Baldi et al. | 437/187 |
| 5,289,035 | 2/1994 | Bost et al. | 257/750 |
| 5,374,591 | 12/1994 | Hasegawa et al. | 437/187 |

FOREIGN PATENT DOCUMENTS 245627  11/1987  European Pat. Off. .
9208400  9/1992  Rep. of Korea .

OTHER PUBLICATIONS

"Tungsten Plug Formation By An Optimized Tungsten Etch Back Process in Non–Fully Planarized Topology"; Appl. Surf. Sci. (Netherlands); vol. 53; 1991; Abstract Only; Koller et al.

*Primary Examiner*—R. Bruce Breneman
*Assistant Examiner*—George Goudreau
*Attorney, Agent, or Firm*—Fish & Richardson P.C.

[57] ABSTRACT

The present invention discloses a method of forming a tungsten plug within a via hole in which it sequentially forms a barrier metal layer and a tungsten layer on a insulating film including the via hole, forms a photoresist pattern of which size is enough to cover the via hole on the tungsten layer in the upper side of the via hole, etching the tungsten layer by sequentially performing an isotropic etching process and an anisotropic etching process using the photoresist pattern as an etching mask and, after the photoresist pattern is removed, etching the projections of the tungsten layer by performing the anisotropic etching process.

10 Claims, 3 Drawing Sheets

METHOD OF FORMING A TUNGSTEN PLUG IN A SEMICONDUCTOR DEVICE

FIELD OF THE INVENTION

The present invention relates to a method of forming a tungsten plug (W-Plug) in a semiconductor device, more particularly to a method of forming a tungsten plug in a semiconductor device, which enables tungsten to be filled up within a via hole to form a metal line with a line width less than submicron meter in the manufacture of a semiconductor device.

BACKGROUND OF THE INVENTION

As metal lines in a semiconductor device are gradually micronized and multi-layered, there occurs a problem that a conventional process of forming an Aluminum line is unable to sufficiently fill up a via hole below a submicron meter. In order to overcome this problem, the conventional method formed a tungsten plug within the via hole by depositing tungsten over the entire structure after forming the via hole, and then etching the deposited tungsten by a blanket etching process.

FIG. 1 shows a sectional view of a device for explaining a problem occurring in a case that tungsten is not over etched performed so as to reduce an etching loss of tungsten in a via hole in the formation of a tungsten plug according to a conventional method.

A First insulating film 2 is formed on a wafer 1. A plurality of underneath metal lines 3 are formed on the first insulating film 2. A second insulating film 4 is formed on the first insulating film 2 including the plurality of the underneath metal lines 3. Some portions of the second insulating film 4 are etched to expose any one of the surfaces of the underneath metal lines 3, thereby forming a via hole. Titanium(Ti) and Titanium Nitride(TiN) are sequentially deposited to form a barrier metal layer 5 on the second insulating film 4 including the via hole. A tungsten plug 6F is formed within the via hole by depositing tungsten on the barrier metal layer 5 and then etching the deposited tungsten by a blanket etching process. In FIG. 1, during the blanket etching process, tungsten is not over etched so as to obtain a preferred tungsten plug 6F. As a result, though a preferred tungsten plug 6F can be obtained without an etching loss of tungsten in the via hole, there remains a tungsten residue 6A at the groove which is created on the surface of the second insulating film 4 due to the differences of topology. The tungsten residue 6A, which induces a bridge effect to occur between neighboring metal lines, has an adverse effect on reliability of the device. Then, an upper metal line 7 connected to the tungsten plug 6F is formed on the second insulating film 4.

FIG. 2 shows a sectional view of a device for explaining a problem occurring in a case that tungsten is over etched so as to prevent a bridge effect between neighboring metal lines in the formation of a tungsten plug according to a conventional method.

The process before the barrier metal layer 5 is formed, is same with the process explained in FIG. 1. A tungsten plug 6F is formed within a via hole through a tungsten lamination process and a blanket etching process. However, in order to solve the problem occurring due to the tungsten residue 6A as shown in FIG. 1, as an over etching is performed in the process of the blanket etching process, the upper portion of the tungsten plug 6F is heavily conceived and thus it reduces reliability of the device because of misconnection with the upper metal line 7 which is formed thereafter. In addition, as the barrier metal layer 5 is damaged as indicated 5A and thus it weakens an adhesive strength between the second insulating film 4 and the upper metal line 7, there occurs a problem that reduces reliability of the device due to a lift effect of the upper metal line 7.

SUMMARY OF THE INVENTION

Therefore, the object of the present invention is to provide a method of forming a tungsten plug in a semiconductor device which can prevent an etching loss of tungsten in a via hole, while removing a tungsten residue remaining at the groove on the surfaces of insulating film.

To achieve the above object, a method form forming a tungsten plug in a semiconductor device in which lower metal lines and upper metal lines are connected through via holes which are formed by etching some portions of an insulating film in a semiconductor device, the method comprising.

A. sequentially forming a barrier metal layer and a tungsten layer on the insulating film including the via hole, B. forming, on the tungsten layer in the upper side of the via hole, a photoresist pattern of which size is enough to cover the via hole, C. firstly etching the tungsten layer by an isotropic etching process using the photoresist pattern as etch mask, D. secondly etching the firstly-etched tungsten layer by an anisotropic etching process using the photoresist pattern as an etching mask until the barrier layer is exposed, and E. after the photoresist mask is removed, removing the projections of the tungsten layer which are created on the upper portion of the via hole as a result of the isotropic etching process and the anisotropic etching process, thereby forming a tungsten plug within the via hole.

A method for forming a tungsten plug in a semiconductor device in which lower metal lines and upper metal lines are connected through via holes which are formed by etching some portions of an insulating film in a semiconductor device, said process comprising.

A. sequentially forming a barrier metal layer and a tungsten layer on the insulating film including the via hole, B. forming, on the tungsten layer in the upper side of the via hole, a photoresist pattern of which size is enough to cover the via hole, C. firstly etching the tungsten layer by an isotropic etching process using the photoresist pattern as an etching mask, D. after the photoresist mask is removed, etching the firstly-etched tungsten layer by an anisotropic etching process until the barrier metal layer is exposed, thereby forming a tungsten plug within the via hole.

BRIEF DESCRIPTION OF THE DRAWINGS

For fuller understanding of the nature and objects of the invention, reference should be made to the following detailed description and the accompanying drawings in which.

Similar reference characters refer to similar parts in the several views of the drawings.

DESCRIPTION OF THE INVENTION

The present invention will be explained below in detail by reference to the accompanying drawings.

FIG. 3A to FIG. 3D show sectional views of a device for explaining a method of forming a tungsten plug in a semiconductor device according to one embodiment of the present invention.

Figure 1:
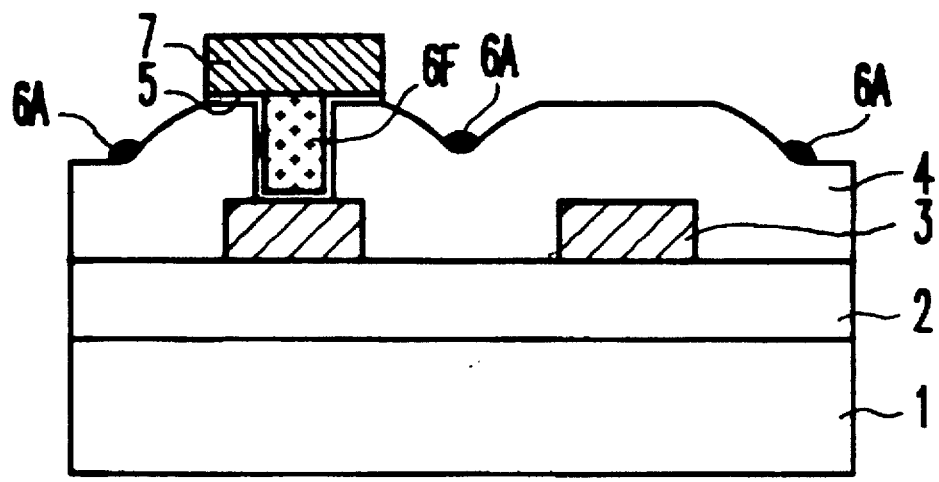
FIG. 1 and FIG. 2 show sectional views of a devices for explaining a problem occurring in the process of forming a conventional tungsten plug.
Figure 2:
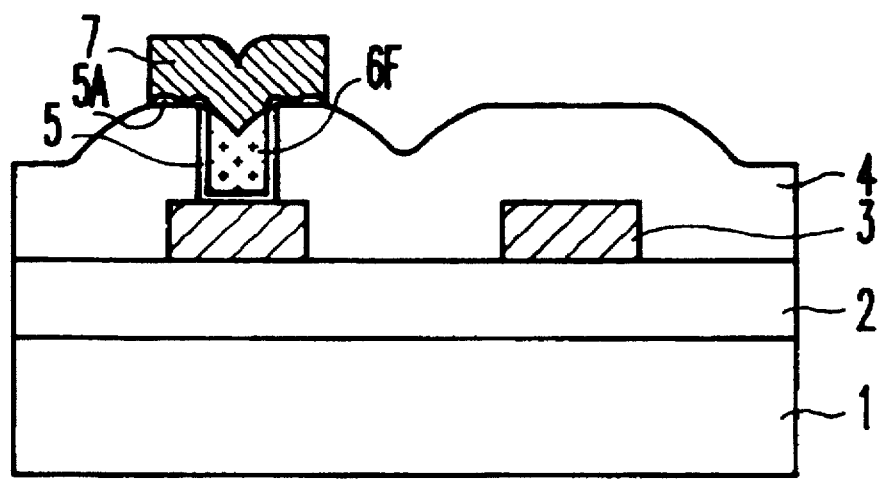
Figure 3A:
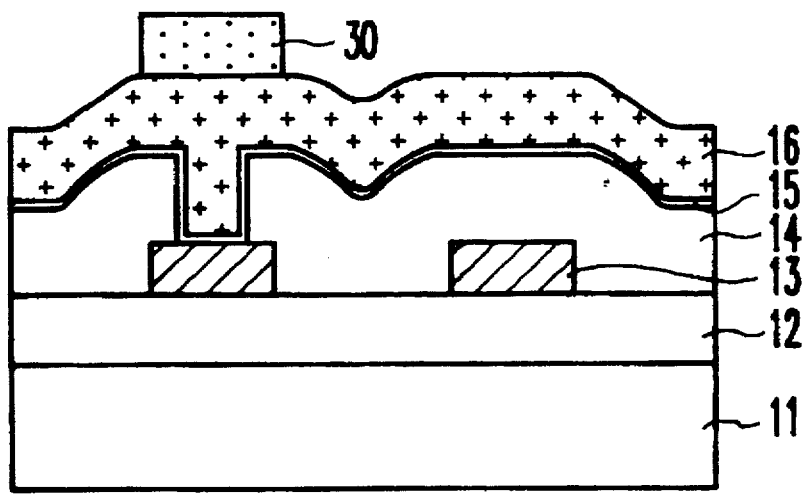
FIG. 3A to FIG. 3D show sectional views of a device for explaining a method of forming a tungsten plug in a semiconductor device according to one embodiment of the present invention.

Referring to FIG. 3A, a first insulating film 12 is formed on a wafer 11. A plurality of lower metal lines 13 are formed on the first insulating film 12. A second insulating film 14 is formed on the first insulating film 12 including the plurality of lower metal lines 13. In order to expose one of the surfaces of the plurality of lower metal lines 13, some portions of the second insulating film 14 are etched to form a via hole. Titanium(Ti) and Titanium Nitride(TiN) are sequentially deposited to form a barrier metal layer 15 on the second insulating film 14 including the via hole. A tungsten layer 16 is formed on the barrier metal layer 15 by depositing tungsten in thickness sufficient to fill up the via hole. On the tungsten layer 16 is formed a photoresist pattern 30 which is formed enough to cover the via hole on the upper side of it.

Figure 3B:
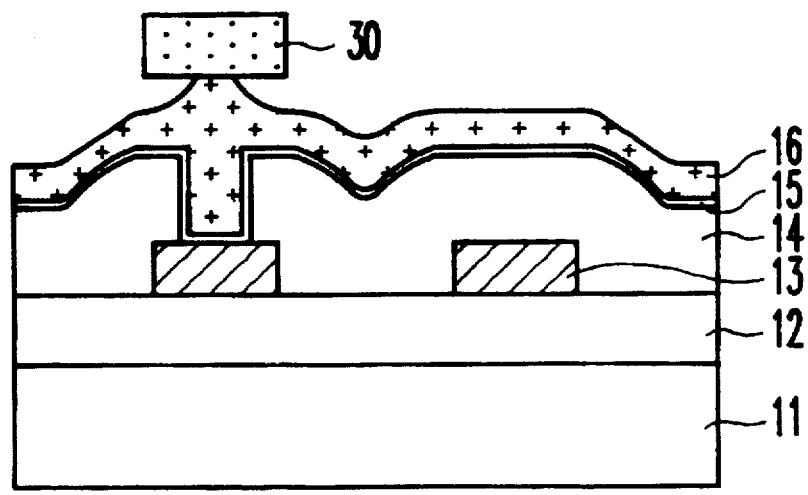

FIG. 3B shows a sectional view of the device, in which an isotropic etching process is performed until the tungsten layer 16 is etched in thickness of about more than 50% with respect to the entire thickness of the tungsten layer 16 using the photoresist pattern 30 as an etch mask. The isotropic etching process uses a solution comprising HF, $HNO_3$, $CH_3COOH$ and an ultra pure water in a constant ratio, and the etching speed of the tungsten should be maintained approximately at 300 to 500 Å/min.

Figure 3C:
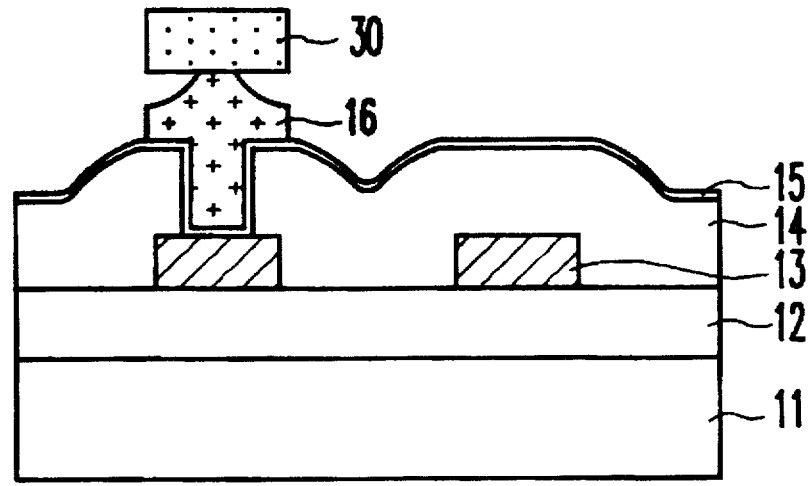

FIG. 3C shows a sectional view of the device, in which the tungsten layer 16 remained after being firstly etched through an isotropic etching process is secondly etched until the barrier metal layer 15, is exposed by an anisotropic etching process which uses the photoresist pattern 30 as the etch mask the anisotropic etching process is performed using $SF_6$ gas.

Figure 3D:
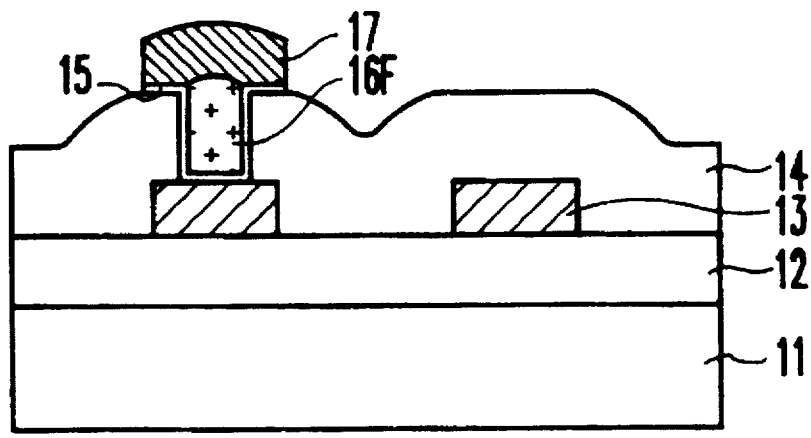

Referring to FIG. 3D, after the photoresist pattern 30 is removed, the projections of the tungsten layer 16 which are created on the upper portion of the via hole as a result of the isotropic etching process and the anisotropic etching process are removed to form a tungsten plug 16F formed within the via hole. Additional projections of the tungsten layer 16 are removed by performing an another isotropic etching process using $SF_6$ gas. Then, conducting materials such as Aluminum are deposited on it, and an upper metal line 17 connected to the tungsten plug 16F is formed by the lithography process and the etching process.

Figure 4A:
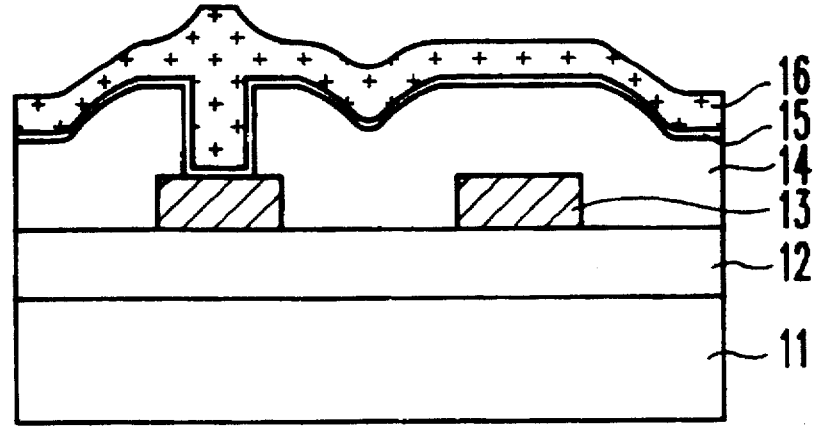
FIG. 4A and FIG. 4B show sectional views of a device for explaining a method of forming a tungsten plug in a semiconductor device according to an another embodiment of the present invention.
Figure 4B:
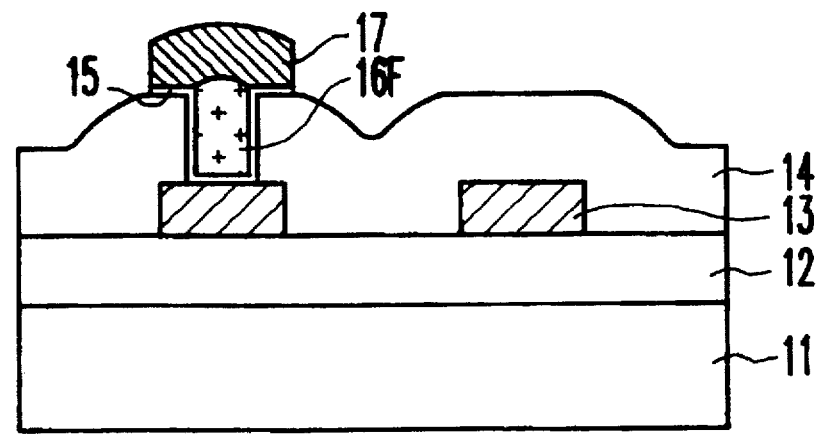

FIG. 4A and FIG. 4B show sectional views of a device for explaining a method of forming a tungsten plug in a semiconductor device according to an another embodiment of the present invention.

FIG. 4A shows a sectional view of the device, in which the photoresist pattern 30 is removed in FIG. 3B after the process same with the one which is explained in FIG. 3A and FIG. 3B of embodiments of the present invention, is performed.

FIG. 4B shows a sectional views of the device, in which the tungsten layer 16 firstly etched by an isotropic etching process is etched by performing an anisotropic etching process using $SF_6$ gas until the barrier metal layer 15 is exposed. conducting materials such as Aluminum are deposited and an upper metal line 17 connected to the tungsten plug 16F is formed by the lithography process and the etching process.

As described above, according to the one and another embodiments of the present invention, they can form a preferred tungsten plug by preventing an etching loss of tungsten in a via hole, while reducing a tungsten residue existing at the groove on the surfaces of the insulating film. Therefore, the present invention has an outstanding effect which can prevent a bridge effect between metal lines and a lift effect of the metal lines.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of forming a tungsten plug in a semiconductor device in which lower metal lines and upper metal lines are connected through a via hole which is formed by etching some portions of an insulating film in a semiconductor device, the method comprising:

A. sequentially forming a barrier metal layer and a tungsten layer on said insulating film including said via hole;

B. forming, on the tungsten layer in the upper side of the via hole, a photoresist pattern of which size is enough to cover said via hole;

C. firstly etching said tungsten layer by an isotropic etching process using said photoresist pattern as an etch mask;

D. secondly etching the firstly-etched tungsten layer by an anisotropic etching process using said photoresist pattern as an etch mask so that the barrier layer is exposed; and E. after said photoresist mask is removed, removing the projections of said tungsten layer which are created on the upper portion of said via hole as a result of said isotropic etching process and said anisotropic etching process, whereby forming a tungsten plug within said via hole.

2. A method of forming a tungsten plug in a semiconductor device according to claim 1, wherein said isotropic etching process is performed by a solution comprising HF, $HNO_3$, $CH_3COOH$ and water.

3. A method of forming a tungsten plug in a semiconductor device according to claim 1, wherein said isotropic etching process is performed until said tungsten layer is etched to a thickness which is approximately greater than 50% of the entire thickness of said tungsten layer.

4. A method of forming a tungsten plug in a semiconductor device according to claim 1, wherein said anisotropic etching process is performed by using $SF_6$ gas.

5. A method for forming a tungsten plug in a semiconductor device according to claim 1, wherein said projections of said tungsten plug are removed by an anisotropic etching process.

6. A method for forming a tungsten plug in a semiconductor device according to claim 5, wherein said anisotropic etching process is performed by using $SF_6$ gas.

7. A method of forming a tungsten plug in a semiconductor device in which lower metal lines and upper lines are connected through via hole which is formed by etching some portion of an insulating film in a semiconductor device, the method comprising:

A. sequentially forming a barrier metal layer and a tungsten layer on said insulating film including said via hole;

B. forming, on said tungsten layer in an upper side of the via hole, a photoresist pattern having a large size which is large enough to cover said via hole;

C. firstly etching said tungsten layer by an isotropic etching process using the photoresist pattern as an etch mask;

D. after the photoresist mask is removed, etching the firstly-etched tungsten layer by an anisotropic etching process until said barrier metal layer is exposed, thereby forming a tungsten plug within said via hole.

8. A method of forming a tungsten plug in a semiconductor device according to claim 7, wherein said isotropic etching process is performed by a solution comprising HF, $HNO_3$, $CH_3COOH$ and water.

9. A method of forming a tungsten plug in a semiconductor device according to claim 7, wherein said isotropic etching process is performed until said tungsten layer is etched to a thickness which is approximately greater than 50% of the entire thickness of said tungsten layer.

10. A method of forming a tungsten plug in a semiconductor device according to claim 7, wherein said anisotropic etching process is performed by $SF_6$ gas.

* * * * *